(12) United States Patent
Baretz et al.

(10) Patent No.: US 7,943,945 B2
(45) Date of Patent: *May 17, 2011

(54) SOLID STATE WHITE LIGHT EMITTER AND DISPLAY USING SAME

(75) Inventors: Bruce Baretz, West Milford, NJ (US); Michael A. Tischler, Danbury, CT (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/264,124

(22) Filed: Nov. 1, 2005

(65) Prior Publication Data

US 2006/0049416 A1   Mar. 9, 2006

Related U.S. Application Data

(63) Continuation of application No. 10/623,198, filed on Jul. 18, 2003, now Pat. No. 7,615,795, which is a continuation of application No. 08/621,937, filed on Mar. 6, 1996, now Pat. No. 6,600,175.

(51) Int. Cl.
*H01L 33/00* (2010.01)
(52) U.S. Cl. ............................ 257/98; 257/99; 257/100
(58) Field of Classification Search ............... 257/79, 257/81–82, 94–95, 88, 98–100, E33.059, 257/E33.061
See application file for complete search history.

(56) References Cited

U.S. PATENT DOCUMENTS

| | | | |
|---|---|---|---|
| 3,290,255 A | 12/1966 | Smith | |
| 3,593,055 A | 7/1971 | Geusic et al. | |
| 3,676,668 A | 7/1972 | Collins et al. | |
| 3,763,405 A | 10/1973 | Mitsuhata | |
| 3,819,974 A * | 6/1974 | Stevenson et al. | 313/499 |
| 3,849,707 A | 11/1974 | Braslau et al. | |
| 3,875,456 A * | 4/1975 | Kano et al. | 313/501 |
| 3,932,881 A | 1/1976 | Mita et al. | |
| 3,972,717 A | 8/1976 | Wiedemann | |
| 4,176,299 A | 11/1979 | Thornton | |
| 4,443,532 A | 4/1984 | Joy et al. | |

(Continued)

FOREIGN PATENT DOCUMENTS

EP     0647694 A1    4/1995

(Continued)

OTHER PUBLICATIONS

Hamakawa, Yoshihiro, et al., Toward a visible light display by amorphous SiC:H alloy system, Optoelectronics—Devices and Technologies, Dec. 1989, pp. 281-294, vol. 4, No. 2.

(Continued)

*Primary Examiner* — Wael M Fahmy
*Assistant Examiner* — Abul Kalam
(74) *Attorney, Agent, or Firm* — Steven J. Hultquist; Hultquist IP

(57) ABSTRACT

A light emitting assembly comprising a solid state device coupleable with a power supply constructed and arranged to power the solid state device to emit from the solid state device a first, relatively shorter wavelength radiation, and a down-converting luminophoric medium arranged in receiving relationship to said first, relatively shorter wavelength radiation, and which in exposure to said first, relatively shorter wavelength radiation, is excited to responsively emit second, relatively longer wavelength radiation. In a specific embodiment, monochromatic blue or UV light output from a light-emitting diode is down-converted to white light by packaging the diode with fluorescent organic and/or inorganic fluorescers and phosphors in a polymeric matrix.

41 Claims, 6 Drawing Sheets

U.S. PATENT DOCUMENTS

| | | | |
|---|---|---|---|
| 4,559,470 A | | 12/1985 | Murakami et al. |
| 4,573,766 A | | 3/1986 | Bournay, Jr. et al. |
| 4,618,555 A | | 10/1986 | Suzuki et al. |
| 4,638,214 A | | 1/1987 | Beers et al. |
| 4,667,036 A | | 5/1987 | Iden et al. |
| 4,727,003 A | | 2/1988 | Ohseto et al. |
| 4,772,885 A | | 9/1988 | Uehara et al. |
| 4,845,223 A | | 7/1989 | Seybold et al. |
| 4,859,539 A | | 8/1989 | Tomko et al. |
| 4,946,621 A | | 8/1990 | Fouassier et al. |
| 4,992,704 A | * | 2/1991 | Stinson .................. 315/312 |
| 5,077,161 A | | 12/1991 | Law |
| 5,110,931 A | | 5/1992 | Dietz et al. |
| 5,126,214 A | | 6/1992 | Tokailin et al. |
| 5,131,916 A | | 7/1992 | Eichenauer et al. |
| 5,143,433 A | | 9/1992 | Farrell |
| 5,143,438 A | | 9/1992 | Giddens et al. |
| 5,166,761 A | | 11/1992 | Olson et al. |
| 5,208,462 A | * | 5/1993 | O'Connor et al. ......... 250/493.1 |
| 5,211,467 A | * | 5/1993 | Seder .................. 362/84 |
| 5,237,182 A | * | 8/1993 | Kitagawa et al. ............. 257/15 |
| 5,264,034 A | | 11/1993 | Dietz et al. |
| 5,283,425 A | | 2/1994 | Imamura |
| 5,405,709 A | | 4/1995 | Littman et al. |
| 5,518,808 A | | 5/1996 | Bruno et al. |
| 5,535,230 A | * | 7/1996 | Abe .................. 372/50.23 |
| 5,557,168 A | * | 9/1996 | Nakajima et al. ............. 313/586 |
| 5,563,621 A | * | 10/1996 | Silsby .................. 345/43 |
| 5,578,839 A | | 11/1996 | Nakamura et al. |
| 5,583,349 A | | 12/1996 | Norman et al. |
| 5,619,356 A | | 4/1997 | Kozo et al. |
| 5,660,461 A | | 8/1997 | Ignatius et al. |
| 5,677,417 A | * | 10/1997 | Muellen et al. ............. 528/310 |
| 5,770,887 A | * | 6/1998 | Tadatomo et al. ........... 257/613 |
| 5,771,039 A | | 6/1998 | Ditzik |
| 5,777,350 A | * | 7/1998 | Nakamura et al. ............. 257/96 |
| 5,869,199 A | | 2/1999 | Kido |
| 6,137,217 A | | 10/2000 | Pappalardo et al. |
| 6,600,175 B1 | * | 7/2003 | Baretz et al. .................. 257/100 |
| 7,615,795 B2 | | 11/2009 | Baretz et al. |
| 2004/0016938 A1 | | 1/2004 | Baretz et al. |
| 2006/0049416 A1 | | 3/2006 | Baretz et al. |
| 2008/0224597 A1 | | 9/2008 | Baretz et al. |
| 2008/0224598 A1 | | 9/2008 | Baretz et al. |

FOREIGN PATENT DOCUMENTS

| | | | |
|---|---|---|---|
| GB | 2 017 409 | A | 10/1979 |
| JP | S50-79379 | A1 | 11/1973 |
| JP | 60170194 | A1 | 9/1985 |
| JP | S62-189770 | A1 | 8/1987 |
| JP | H01-179471 | A1 | 7/1989 |
| JP | 01-260707 | A1 | 10/1989 |
| JP | H02-91980 | A1 | 3/1990 |
| JP | H3-24692 | A1 | 3/1991 |
| JP | 4010665 | A | 1/1992 |
| JP | 4010666 | A | 1/1992 |
| JP | 04-289691 | A | 10/1992 |
| JP | 4289691 | B1 | 10/1992 |
| JP | 5152609 | B1 | 6/1993 |
| JP | H05-152609 | | 6/1993 |
| JP | 6207170 | A | 7/1994 |
| JP | 6-267301 | A | 9/1994 |
| JP | 6283755 | A | 10/1994 |
| JP | 07-099345 | | 4/1995 |
| JP | H07-176794 | A1 | 7/1995 |
| JP | 07-235207 | | 9/1995 |
| JP | H7-282609 | A1 | 10/1995 |
| JP | H08-7614 | A1 | 1/1996 |
| JP | H9-306393 | | 3/1999 |
| JP | P2003-67318 | | 8/2003 |
| JP | P2004-11214 | | 9/2005 |
| JP | P2004-280288 | | 9/2005 |
| WO | WO 9108508 | * | 6/1991 |

OTHER PUBLICATIONS

Hirano, Masao, et al., Various performances of fiber-optical temperature sensor utilizing infrared-to-visible conversion phosphor, Electrochemisty (JP), Feb. 1987, pp. 158-164, vol. 55, No. 2, Publisher: Electrochemical Society of Japan.

Kido, J., et al., White light-emitting organic electroluminescent devices using the poly(N-vinylcarbazole) emitter layer doped with . . ., Appl. Phys. Lett., Feb. 14, 1994, pp. 815-817, vol. 64, No. 7.

Larach, S., et al., Blue emitting luminescent phosphors: Review and status, Int'l Workshop on Electroluminescence, 1990, pp. 137-143.

Maruska, H.P., et al., Violet luminescence of Mg-doped GaN, Appl. Phys. Lett., Mar. 15, 1973, pp. 303-305, vol. 22, No. 6.

Mimura, Hidenori, et al., Visible electroluminescence from uc-SiC/porous Si/c-Si p-n junctions, Int. J. Optoelectron., 1994, pp. 211-215, vol. 9, No. 2.

Miura, Noboru, et al., Several Blue-Emitting Thin-Film Electroluminescent Devices, Jpn. J. Appl. Phys., Jan. 15, 1992, pp. L46-L48, vol. 31, No. Part 2, No. 1A/B.

Tanaka, Shosaku, et al., White Light Emitting Thin-Film Electroluminescent Devices with SrS:Ce,Cl/ZnS:Mn Double Phosphor Layers, Jpn. J. Appl. Phys., Mar. 20, 1986, pp. L225-L227, vol. 25, No. 3.

Yoshimi, Masashi, et al., Amorphous carbon basis blue light electroluminescent device, Optoelectronics—Devices and Technologies, Jun. 1992, pp. 69-81, vol. 7, No. 1.

Zdanowski, Marek, Pulse operating up-converting phosphor LED, Electron Technol., 1978, pp. 49-61, vol. 11, No. 3.

Zhiming, Chen, et al., Amorphous thin film white-LED and its light-emitting mechanism, Conference Record of the 1991 International Display Research Conference, Oct. 1991, pp. 122-125.

U.S. Appl. No. 12/131,118, filed Jun. 1, 2008, Baretz, Bruce, et al.

U.S. Appl. No. 12/131,119, filed Jun. 1, 2008, Baretz, Bruce, et al.

McGraw-Hill, "McGraw-Hill Dictionary of Scientific and Technical Terms, Third Edition", 1984, pp. 912 and 1446, Publisher: McGraw-Hill.

McGraw-Hill, "McGraw-Hill Encyclopedia of Science and Technology, Sixth Edition", 1987, pp. 582 and 60-63, vol. 9-10, Publisher: McGraw-Hill.

Morkoc, H. et al., "Large-band-gap SiC, III-V nitride, and II-VI ZnSe-based semiconductor device technologies", Aug. 1, 1994, pp. 1363-1398, vol. 76, No. 3.

Adachi, C. et al., "Blue light-emitting organic electroluminescent devices", "Appl. Phys. Lett.", Feb. 26, 1990, pp. 799-801, vol. 56, No. 9.

Armaroli, N. et al, "Supramolecular Photochemistry and Photophysics.", "J. Am. Chem. Soc.", 1994, pp. 5211-5217, vol. 116.

Berggren, M. et al., "Light-emitting diodes with variable colours from polymer blends", "Nature", Dec. 1, 1994, pp. 444-446, vol. 372.

Boonkosum, W. et al, "Novel Flat Panel display made of amorphous SiN:H/SiC:H thin film LED", "Physical Concepts and Materials for Novel Optoelectronic Device Applications II", 1993, pp. 40-51, vol. 1985.

Comrie, M., "Full Color LED Added to Lumex's Lineup", "EBN", Jun. 19, 1995, p. 28.

Forrest, S. et al "Organic emitters promise a new generation of displays", "Laser Focus World", Feb. 1995, pp. 99-107.

Hamada, Y. et al., "Blue-Light-Emitting Organic Electroluminescent Devices with Oxadiazole Dimer Dyes as an Emitter", "Jpn. J. Appl. Physics", Jun. 1992, pp. 1812-1816, vol. 31.

Kido, J. et al., "1,2,4-Triazole Derivative as an Electron Transport Layer in Organic Luminescent Devices", "Jpn. J. Appl. Phys.", Jul. 1, 1993, pp. L917-L920, vol. 32.

Kido, J. et al., "Bright blue electroluminescence from poly(N-vinylcarbazole)", "Appl. Phys. Letters", Nov. 8, 1993, pp. 2627-2629, vol. 63, No. 19.

Pacific Polytech Inc., "P/T 1002 A/B Optoelectronic Liquid Encapsulant Technical Bulletin", 1995, pp. 1-2, Publisher: Pacific Polytech Inc.

Roman, D., "LEDs Turn a Brighter Blue", "Newspaper Article", N/A, p. 1, Publisher: Ledtronics Inc.

Ura, M., "Recent trends of development of silicon monocarbide blue-light emission diodes", "Kinzoku (Japanese Language Journal)", 1989, pp. 11-15, vol. 59, No. 9.

Werner, K., "Higher Visibility for LEDs", "IEEE Spectrum", Jul. 1994, pp. 30-39.

Wojciechowski, J. et al., "Infrared-To-Blue Up-Converting Phosphor", "Electron Technology", 1978, pp. 31-47, vol. 11, No. 3.

Yamaguchi, Y. et al., "High-Brightness SiC Blue LEDs and Their Application to Full Color LED Lamps", "Optoelectronics—Devices and Technologies", Jun. 1992, pp. 57-67, vol. 7, No. 1.

May 4, 2010 Office Action in U.S. Appl. No. 12/131,119.

Aug. 26, 2010 Office Action in U.S. Appl. No. 12/131,118.

Nov. 30, 2010 Office Action in U.S. Appl. No. 12/131,118.

Jan. 7, 2011 Office Action in U.S. Appl. No. 12/131,119.

Akasaki, Isamu, et al., Photoluminescence of Mg-doped p-type GaN and electroluminescence of GaN p-n junction LED, Journal of Luminescence, Jan.-Feb. 1991, p. 666-670, vol. 48-49 pt. 2.

Amano, H., et al., UV and blue electroluminescence from Al/GaN:Mg/GaN LED treated with low-energy electron beam irradiation (LEEBI), Institute of Physics Conference Series, 1990, p. 725 vol. 106.

Berggren, M., et al., White light from an electroluminescent diode made from poly[3(4-octylphenyl)-2,2'-bithiophene] and an oxadiazole . . . , Journal of Applied Physics, Dec. 1994, pp. 7530-7534, vol. 76, No. 11.

Chao, Zhang Jin, et al., White light emitting glasses, Journal of Solid State Chemistry, 1991, pp. 17-29, vol. 93.

El Jouhari, N. et al., White light generation using fluorescent glasses activated by Ce3+, Tb3+ and Mn2+ ions, Journal De Physique IV, Colloque C2, Oct. 1992, pp. 257-260, vol. 2.

Kido, J., et al., White light-emitting organic electroluminecent devices using poly(N-vinlycarbazole) emitter layer doped with three . . . , Applied Physics Letters, Feb. 1994, pp. 815-817, vol. 64, No. 7.

Munch, W.V., et al., Silicon carbide light-emitting diodes with epitaxial junctions, Solid-State Electronics, Oct. 1976, pp. 871-874, vol. 19, No. 10.

Pankove, J.I., et al., Scanning electron microscopy studies of GaN, Journal of Applied Physics, Apr. 1975, pp. 1647-1652, vol. 46, No. 4.

Sato, Yuichi, et el., Full-color fluorescent display devices using a near-UV light-emitting diode, Japanese Journal of Applied Physics, Jul. 1996, pp. L838-L839, vol. 35, No. 7A.

Tanaka, Shosaku, et al., Bright white-light electroluminescence based on nonradiative energy transfer in Ce- and Eu-doped SrS thin films, Applied Physics Letters, Nov. 1987, pp. 1661-1663, vol. 51, No. 21.

Maruska, H.P., Gallium nitride light-emitting diodes (dissertation), Dissertation Submitted to Stanford University, Nov. 1973.

\* cited by examiner

US 7,943,945 B2

SOLID STATE WHITE LIGHT EMITTER AND DISPLAY USING SAME

CROSS-REFERENCE TO RELATED APPLICATIONS

This is a continuation of U.S. patent application Ser. No. 10/623,198 filed Jul. 18, 2003, and issued Nov. 10, 2009 as U.S. Pat. No. 7,615,795, which in turn is a continuation of U.S. patent application Ser. No. 08/621,937 filed Mar. 6, 1996, now U.S. Pat. No. 6,600,175. Priority of said U.S. Patent Applications is claimed under the provisions of 35 USC 120.

FIELD OF THE INVENTION

This invention relates to solid state light emitting devices such as light emitting diodes and more particularly to such devices which produce white light.

BACKGROUND OF THE INVENTION

Solid state light emitting devices, including solid state lamps including LEDs are extremely useful because they potentially offer lower fabrication costs and long term durability benefits over conventional incandescent and fluorescent lamps. Due to their long operation (burn) time and low power consumption, solid state light emitting devices frequently provide a functional cost benefit, even when their initial cost is greater than that of conventional lamps. However, because large scale semiconductor manufacturing techniques can be used, many solid state lamps can be produced at extremely low cost. One such device is the solid state light emitting diode (LED) which has low fabrication costs, long operational lifetimes and low maintenance costs.

Light emitting diodes (LEDs), and similarly constructed super luminescent diodes and semiconductor diode lasers, are commercially available and a wide variety of designs and manufacturing techniques have been developed. In addition to applications such as indicator lights on home and consumer appliances, audio visual equipment, telecommunication devices and automotive instrument markings, such LEDs have found considerable application in indoor and outdoor informational displays. But until recently, LEDs have produced light only in the red, green or amber ranges and have not been generally suitable for replacing, for example, incandescent bulbs, with normally a white luminescence, in a wide variety of display applications. The recent introduction of a bright blue LED, however, allows white light LED systems to be realized and thus has the potential to open the display market to LEDs by providing a practical means to achieve both full color and white light illumination.

The practical advantages of LED displays over those using incandescent bulbs are many. The operational lifetime (in this case, defined as continual illumination) of a LED is on the order of ten years or over 50,000 hours, whereas incandescent bulbs often burn out in the order of 2000 hours, thus leaving an empty pixel in the display message. Such recurrent failures make a display unreadable and, therefore, not useful. These conditions (i.e., broken or missing pixels) require constant repair leading to a significant maintenance problem for providers of display signs based on incandescent illumination devices. With the long operational lifetime of a LED-based sign board, the pixels rarely burn out and the illuminated message remains legible over long operational periods.

Similarly, LED lamps are considerably more robust. When exposed to stress, mechanical shocks, or temperature variations often encountered in an outdoor environment they are less likely to fail than incandescent lamps. This attribute is especially important when the signage is utilized in an environment such as vehicular traffic, e.g., roadway signage to mark highway construction sites, bridges, tunnels, or traffic control markings, in which perishable filaments used in the incandescent lamps frequently break due to constant vibrational motion. Further, incandescent and fluorescent lamps are constructed with fragile glass exterior casings whose breakage makes the lamp useless, and by extension, the message on the sign board illegible. Due to severe environmental conditions on roadways, glass breakage of incandescent and fluorescent lamps is an all too frequent mishap. The solid state LED lamp has no filaments to break and is housed within a durable plastic casing, as the primary device envelope or package (typically being of considerable thickness), thereby exhibiting a high level of imperviousness to extreme outdoor environmental stresses. With respect to outdoor signage applications, displays can contain up to 1 million or more pixels or lamps. Thus the maintenance costs related to replacement of non-operational incandescent lamps or miniature fluorescent (or neon) lamps are high and unfortunately, continual.

Hence, an emerging trend in the manufacturing and marketing of informational displays or signage, especially for outdoor usage, is to utilize solid state LED lamps as replacement for more conventional incandescent bulbs. The major end user benefits are the lower power consumption costs and the longer operational lifetime (hence, reducing maintenance costs). A further benefit is the rapid relaxation times of a solid state device affording an opportunity to display rapidly changing information messages incorporating video or lifelike animation.

Given the desirability of white light displays (e.g., commercial bank "time and temperature" message boards, stadium scoreboards), considerable effort has been expended to produce white light LEDs. Although the recent availability of the blue LED makes a full color, and by extension a white light display realizable, conventionally it has been considered that such a display would require multiple LEDs. The multiple LEDs would be then incorporated into complicated and expensive LED modules to obtain the required broad band illumination necessary to provide white light. Even if a discrete LED lamp were constructed that provides white illumination (as opposed to the utilization of a multitude of single die, single color discrete LED lamps in a module or sub-assembly), the current state of the art requires the utilization of multiple LED dies and typically at least four electrical leads to power these dies. U.S. Pat. No. 4,992,704 issued to Stinson teaches a variable color light emitting diode having a unitary housing of clear molded solid epoxy supporting three LED dies characterized as producing color hues of red, green and blue, respectively. There have been some recent introductions of commercial "full-color" LED lamps, that are essentially discrete lamps which afford a means of producing white light. All currently available examples of such lamps contain a minimum of three LED dies (or chips)—one red, one green and one blue, encapsulated in a single epoxy package. The chips are powered via at least 4 electrical leads. These complicated multiple die, variable color devices provide an expensive and complicated method of offering white light illumination. Furthermore, these multiple die white lamps are rather inefficient in the present state of the art, offering luminosity far below that realized by existing monochromatic light emitting diode lamps, even when a very large quantity of dies are functionally incorporated into the discrete lamp assembly.

The utility of solid state lamps that offer white light illumination is clear. However, at present there is a very limited number of such solid state lamps available. In signage applications where a small pixel of light is frequently required to offer the highest possible resolution of the message or video image, the most practical solid state lamps for display applications are the LED lamps. The LED lamp can have very narrow angles of irradiance and are very small in size when compared with other means of providing a radiant surface. However, the methods of fabricating white LED lamps are limited. A conventional approach is to fabricate a large cluster of red, green and blue LED discrete lamps, housed in multiple lamp (up to 30) subassemblies or modules. By providing multiple power sources to control all of the discrete lamps, these large modules can appear, from a distance, to provide white light by the spatial mixing of blue, green and red subpixels of light given off by the individual discrete LED lamps that comprise the module. While the lamps that make up the modules may be individually addressable, and hence, offer the opportunity to, selectively and individually, provide red, green and blue light (or combinations thereof), such modular systems are complex and costly means of providing white light for a solid state display. Further, as these modules are rather large, the ultimate resolution of the display will always be lower than that of a conventional single lamp pixel display.

Whereas multiple discrete LED dies housed within a single polymeric matrix (as taught by Stinson) may provide a discrete LED lamp such that the illumination could appear white to an observer, the individual LED dies would still need to be individually powered and the lamp would require multiple leads in order to effect the simultaneous emission of multiple wavelength light. Thus, this multiple die LED lamp would be rather expensive to fabricate, and would require expensive and complicated circuitry to power and control in an outdoor display. Despite these problems, both methods point to the utility of generating white illuminance.

It would thus be highly desirable to develop a simple solid state LED lamp, with a minimum of power leads, (i.e., 2) exactly as practiced in single color LED lamps, such that three domains of red, green and blue light are generated and yet the white light emission is apparent to an observer, all while offering significantly reduced die costs (one versus three) and low fabrication costs in the design of corresponding displays and signage, high medium resolution (small pixel or lamp size), rapid switching to the on and off states (to enhance live video imaging), and with a high luminous efficiency.

It is well known that so-called fluorescent lamps provide white light illumination. In a fluorescent lamp, the Hg vapor in the vacuum tube is excited by an electrical discharge. The excited Hg atoms emit light, primarily in the ultraviolet region (e.g., 254 nm, 313 nm, 354 nm), which is absorbed by the inorganic phosphors coating the inside walls of the tube. The phosphors then emit light. These inorganic phosphors are designed as such to offer white light emission by "down-converting" (i.e., transforming a higher frequency, shorter wavelength form of energy to a lower frequency, longer wavelength form of energy) the ultraviolet emissions of the excited states of atomic Hg into a broad spectrum of emitted light which appears as white to the observer. However, these light emitting devices are not solid-state, and miniaturization of these fluorescent bulbs to provide suitable pixel resolution for display applications has never been practically accomplished. In fact, the primary application of miniature fluorescent lamps (with long operational lifetimes but unfortunately high power consumption when compared with solid state LED lamps) in displays is to provide back lighting to liquid crystals that are individually addressed at the pixel level. Furthermore, these miniature fluorescent lamps remain fragile light emitting devices by virtue of their glass housings and are unsuitable for use in display applications in which the lamps are exposed to extreme environmental stresses. Such stresses can not only break the glass housing, but effect delamination of the powder coatings from the interior wall of the glass housing. It would be desirable to generate white light by radiative energy transfer, where the luminescent centers are an integral part of the assembly such that a thick, difficult-to-fracture housing structure (plate or bulb) could provide white illumination from the interior thickness of such housing structure, and not from a semi-permanent powder coating placed on one side of a housing surface.

In a further example of generating white light, in the absence of phosphor coatings, it was disclosed in Chao, et al., "White Light Emitting Glasses," Journal of Solid State Chemistry 93, 17-29 (1991) (see also El Jouhari, N., et al., "White light generation using fluorescent glasses activated by $Ce^{3+}$, $Tb^{3+}$ and $Mn^{2+}$ ions," Journal de Physique IV, Colloque C2, supplement au Journal de Physique III, Volume 2, October 1992, C2-257 to C2-260), that vitreous materials are capable of generating white light by simultaneous emission of blue, green and red emitting fluorescent centers in $B_2O_3$-based glass that simultaneously contain $Ce^{3+}$, $Tb^{3+}$, and $Mn^{2+}$ as activators. These glasses provide white illumination by offering the blue emission of $Ce^{3+}$ as well as by the transfer of excited state energy from the $Ce^{3+}$ to $Te^{3+}$ and $Mn^{2+}$, whose luminescence occurs respectively in the green and red parts of the visible light spectrum.

Mixed rare earth borates can be used to provide white light illumination, via down conversion, with excitation of the borate powders with a primary (ultraviolet) radiation between 250 nm and 300 nm. Similarly, for cathode ray applications, white light-emitting mixed fluorescent materials can be made by careful formulation of green fluorescent materials (48 to 53% w/w), red fluorescent materials (37 to 40% w/w) and blue fluorescent materials (10 to 13% w/w).

While the devices in the above examples vary in concept and construction, they demonstrate the utilization of red, green and blue fluorescent materials, all inorganic in composition which when excited by photons or electron beams, can release multiple wavelengths of secondary light emission (luminescence of either fluorescent or phosphorescent character) to exhibit white light to the observer. This is generally true, even if microscopic domains of discrete colored light emission can be observed on the Lambertian surface of the light emitting device.

Tanaka, S., et al., "Bright white-light electroluminescence based on nonradiative energy transfer in Ce- and Eu-doped SrS films," App. Phys. Lett. 51 (21), Nov. 23 1987, 1662-1663, describes the generation of a white-light emitting thin-film electroluminescent (EL) device using Ce- and Eu-doped strontium sulfide (SrS) inorganic phosphors. In the EL excitation of the SrS:Ce,Eu device, nonradiative energy transfer from the $Ce^{3+}$ luminescent center to the $Eu^{2+}$ luminescent center plays an important role in generating broad EL emission extending from the blue to the red, thereby generating white light.

Similarly, some recent discussions of AlGaN electroluminescent systems with Zn and Si dopants have indicated that some white light can be generated. While it is useful for a single device to be constructed in which dopants offer a multitude of luminescent wavelengths, dopants invariably alter the electrical and lattice structures of semiconductors and as such, the performance of these devices are considerably poorer than for corresponding semiconductors free of dopant that emit monochromatic irradiation, as a result of being dopant-free.

Until recently, most light emitting diodes have been semiconductor-based and most electroluminescent devices have been inorganic based. While organic materials have been utilized to prepare certain thin-film electroluminescent devices, no organic based LEDs are commercially available. Further, organic-based LEDs are at present plagued by extremely short operational lifetimes due to degradation of the organic charge-transfer materials. In all of these systems, the organic materials, used in thin films on conducting inorganic substrates such as ITO, are actively participating in the electron hole recombination necessary to generate an excited state, and, by subsequent radiative decay, light.

Recently, the literature has discussed approaches directed to fabricating organic LED or electroluminescent devices and in certain cases, white light emission has been observed from these experimental designs. As an example, white light from an electroluminescent diode made from poly[3(4-octylphenyl)-2,2'-bithiophene] and an oxadiazole derivative have been reported. Spectroscopic analysis indicates that the apparent white light is composed of blue (410 nm), green (530 nm), and red-orange (520 nm) luminescent centers. Electroluminescent devices incorporating the red fluorescing material Rhodamine onto an inorganic substrate have been effective in yielding some white light as well.

White light emission from thin film organic electroluminescent cells based on poly(vinylcarbazole PVK) thin films on ITO-coated glass has also been recently reported. The cell has the construction of Mg:Ag:Alq:TAZ:doped PVK:ITO: Glass where the conducting ITO layer injects holes into the organic based PVK thin film layer which has high hole drift mobilities. Simultaneously, electrons are injected by the tris (8-quinolato) aluminum (III) complex layer Alq, into the hole blocking electron transporting layer composed of the organic molecule 3-(4'tert-butylphenyl)-4-phenyl-5-(4'-biphenyl)-1, 2,4-triazole, TAZ. At the interface of the organic poly(vinlycarbazole) layer with the TAZ layer, recombination of holes and electrons take place which excites the organic, aromatic, carbazole pendant moiety that comprises the polymer. It is well known that the excited carbazole moiety within the polymer aggregates in the excited state leads to blue excimer emission, in the absence of quenchers or dopants. In the example of the organic Mg:Ag:Alq:TAZ:doped PVK:ITO: Glass electroluminescent device, the quenchers of excimeric emission, are the dopants blue emitting 1,1,4,4-tetraphenylbuta-1,3-diene (TPB), green emitting 7-diethylamino-3-(2'benzothiazoyl)coumarin (Coumarin-6), and red emitting dicyanomethylene-2-methyl-6-p-dimethylaminostyryl-4H-pyran (DCM-1).

U.S. Pat. No. 5,045,709 issued Apr. 11, 1995 to J. E. Littman et al. discloses a white light emitting internal junction organic electroluminescent device comprising an anode, an organic electroluminescent medium and a cathode. The organic electroluminescent medium further comprises a hole injecting and transporting zone contiguous with the anode, and an electron injecting and transporting zone contiguous with the cathode. The electron injecting and transporting zone further comprises an electron injecting layer in contact with the cathode. The portion of the organic electroluminescent medium between the electron injecting layer and the hole injecting and transporting zone emits white light in response to the hole-electron recombination, and comprises a fluorescent material and a mixed ligand aluminum chelate.

Japanese Patent Publication 04289691 of Mitsubishi Cable Industries, Ltd., published Oct. 14, 1992, discloses an electroluminescent device comprising a fluorescent dye-fixed silica layer coated with a transparent electrode layer, a luminescing (light-emitting) layer containing a phosphor, a backside electrode layer, a water-sorbing layer, an encapsulating film, and an insulating layer.

In the Mitsubishi patent publication, the silica layer may be formed by a sol gel process using metal alkoxides in a solvent such as ethanol, isopropanol, or dimethyl ether. A Rhodamine 6G-doped silica layer is described to exhibit white luminescence. The luminescing layer may be for example on the order of 15 microns in thickness, and is formed by a sol gel technique yielding ZnS or ZnCdS doped with a dopant such as copper, aluminum, manganese, chlorine, boron, yttrium, or rare earth dopant. The luminescing layer may also contain scattered phosphor material. The average grain size of grains in the luminescing layer is generally greater than 10 microns, and preferably is in the range of from 15 to 40 microns. The luminescing layer may for example contain from 30 to 80% phosphor. A disclosed advantage of the foregoing structure is that one can change the phosphor in the luminescing layer, and thereby change the color of the whole material.

Japanese Patent Publication 60170194 of Sony Corporation, published Sep. 3, 1985, discloses a white light-emitting electroluminescent device with a luminescent layer containing a mixture of a blue-green-emitting phosphor and Rhodamine S. Since Rhodamine S strongly fluoresces orange by excitation with a bluish-green light, a white light of high luminosity may be obtained even at low voltage. This reference discloses a phosphor emitting blue-green light, in which ZnS is doped with Cu and Cl, as well as a phosphor emitting yellow light, in which ZnS is doped with Cu and Mn. ZnS may also be doped with Cu and Br to produce green light.

The Sony patent publication discloses a multilayer electroluminescent article, including sealing layers of protective film of a material such as Aclar polymer, a polyester layer, a transparent electrode formed of indium tin oxide (ITO), a light-emitting layer, and a backside electrode. The light-emitting layer may comprise 50-95% by weight of ZnS doped with the aforementioned dopant species (e.g., 0.045% wt. Cu, and 0.020% wt. Cl) and 5-50% wt. Rhodamine S.

Not withstanding the progress made in using organic fluorescers as luminescent sites within either electron-transport or hole-transport layers and affording thin-film interfacial hole-electron recombination, the current state of the art finds it difficult to generate organic based LED dies with reasonable operational lifetimes. By their very nature, these donor-acceptor complexes are prone to reaction with the surrounding medium. As a result, many of these organic molecules degrade under constant excitation to the excited state and consequently the organic-based LEDs fail. Those fluorescers with extremely high quantum yields of fluorescence, which by definition necessitate short excited state lifetimes and are unlikely to be quenched or degraded by oxygen or other reactants, do not have sufficient electron or hole transport properties to allow for device-wide localized hole-electron recombination in the ground state. However, their proximity to the holes, as dopants in a hole transporting layer, as an example, may make the excited states of the luminophors more easily oxidized than would normally be the case. This would be especially true for excited state species, even if the ground state of the luminophors are stable to the holes in the hole-transporting layer. Similarly arguments regarding excited state reduction would be applicable for dopants sequestered within an electron-transport layer.

It would be most desirable, then, if a white light emitting LED device could be fabricated that took advantage of the simultaneous emission of red, green and blue luminescent centers, using both inorganic and organic fluorescers or phosphors without requiring these species to be in proximate contact with the transporting layers.

It is the purpose of the present invention to provide white light solid state luminescent devices using a single die, which initially provide monochromatic radiation and wherein the monochromatic radiation is converted to polychromatic white light, thus providing a solid state illumination device with white illuminance, without the need for multiple power leads or for more than one discrete LED lamp.

SUMMARY OF THE INVENTION

The present invention relates broadly to a light emitting assembly comprising a solid state device which is suitably joined by circuit forming means to a power supply, constructed and arranged to power the solid state device and induce the emission from the solid state device of a first, relatively shorter wavelength radiation. The solid state device is structurally associated with a recipient down-converting luminophoric medium which when impinged by the first, relatively shorter wavelength radiation is excited to responsively emit a radiation in the visible white light spectrum.

In accordance with a specific embodiment of the present invention, an LED operative to emit, for example, monochromatic blue or ultraviolet (UV) radiation is packaged along with fluorescent organic and/or inorganic fluorescers and phosphors in an insulating polymeric matrix. The monochromatic blue or UV radiation output of the LED is absorbed and then down converted by the fluorphore or phosphor to yield longer wavelengths to include a broad spectrum of frequencies which appear as white light.

This use of fluorescers and/or phosphors to effect down conversion of light from an LED in a solid state light emitting device using a packing dye material is a significant departure from prior art teaching. In addition to allowing for the generation of white light from a blue or ultraviolet emitting LED die with a typical p-n junction construction, devices in accordance with the invention can be variously constructed to provide an essentially infinite series of colored (visible) light emissions, of either narrow or broad spectral distribution; from one single p-n junction construction. The concept can be extended to any solid-state light emitting device, including super luminescent diodes, diode layers, electroluminescent cells, electroluminescent displays, organic and polymer based light emitting diodes and/or devices, even those not requiring semiconductor p-n junctions, providing an insulating matrix or housing can be attached to or incorporated within the device.

As used herein, the term "solid state device," used in reference to the device for generating the primary radiation which subsequently is down-converted to a longer wavelength radiation in such visible white light spectrum, means a device which is selected from the group consisting of semiconductor light emitting diodes, semiconductor lasers, thin film electroluminescent cells, electroluminescent display panels, organic based light-emitting diodes, polymeric-based light-emitting diodes, and internal junction organic electroluminescent devices.

As used herein, the term "luminophoric medium" refers to a material which in response to radiation emitted by the solid state device emits light in the white visible light spectrum by fluorescence and/or phosphorescence.

Other aspects, features and embodiments of the invention will be more fully apparent from the ensuing description and claims.

DETAILED DESCRIPTION OF THE INVENTION, AND PREFERRED EMBODIMENTS THEREOF

The present invention is based on the discovery that a highly efficient white light-emitting device may be simply and economically fabricated utilizing a solid state light emitting device for generating a shorter wavelength radiation which is transmitted to a luminophor (fluorescent and/or phosphorescent solid material) for down conversion by the luminophor of the radiation from the solid state light emitting device, to yield white light.

White light LED solid state devices may be made by the method of the present invention, utilizing a down conversion process whereby the primary photon generated in the active region of the diode is down converted with primary blue emission and/or secondary blue fluorescent or phosphorescent centers, as well as green and red fluorescent or phosphorescent centers. Such an LED device is able to down-convert the relatively monochromatic light, typical of all heretofore colored LED dies and lamps, to a broader emission that provides white light from red, green, and blue emission centers. Such a device for white light emission, based on downconversion, requires the primary light to be either blue or ultraviolet emission, such as is available using blue or ultraviolet LED dies and lamps. It is an important element of this consideration that both inorganic and organic fluorescent or phosphorescent materials can be utilized to down-convert the primary ultraviolet or blue light emission to a mixture of blue, green and red luminescent emissions. A significant advantage of organic luminescent materials is their relatively broad emission bandwidth which offers the maximal overlap of photon wavelengths to most readily generate a white illumination. Further, it is most desirable to utilize organic fluorescent materials with extremely short radiative lifetimes, less than 50 nanoseconds, to preclude non-radiative energy transfer (to the lowest energy emitter).

As discussed above, there have been disclosures regarding the generation of white light in solid state illumination devices using radiative or non-radiative energy transfer and these examples use primarily inorganic dopants in the active layers of electroluminescent cells or display systems, but none are known that apply the principles of the present invention to semiconductor based p-n junction LED lamps.

Figure 1:
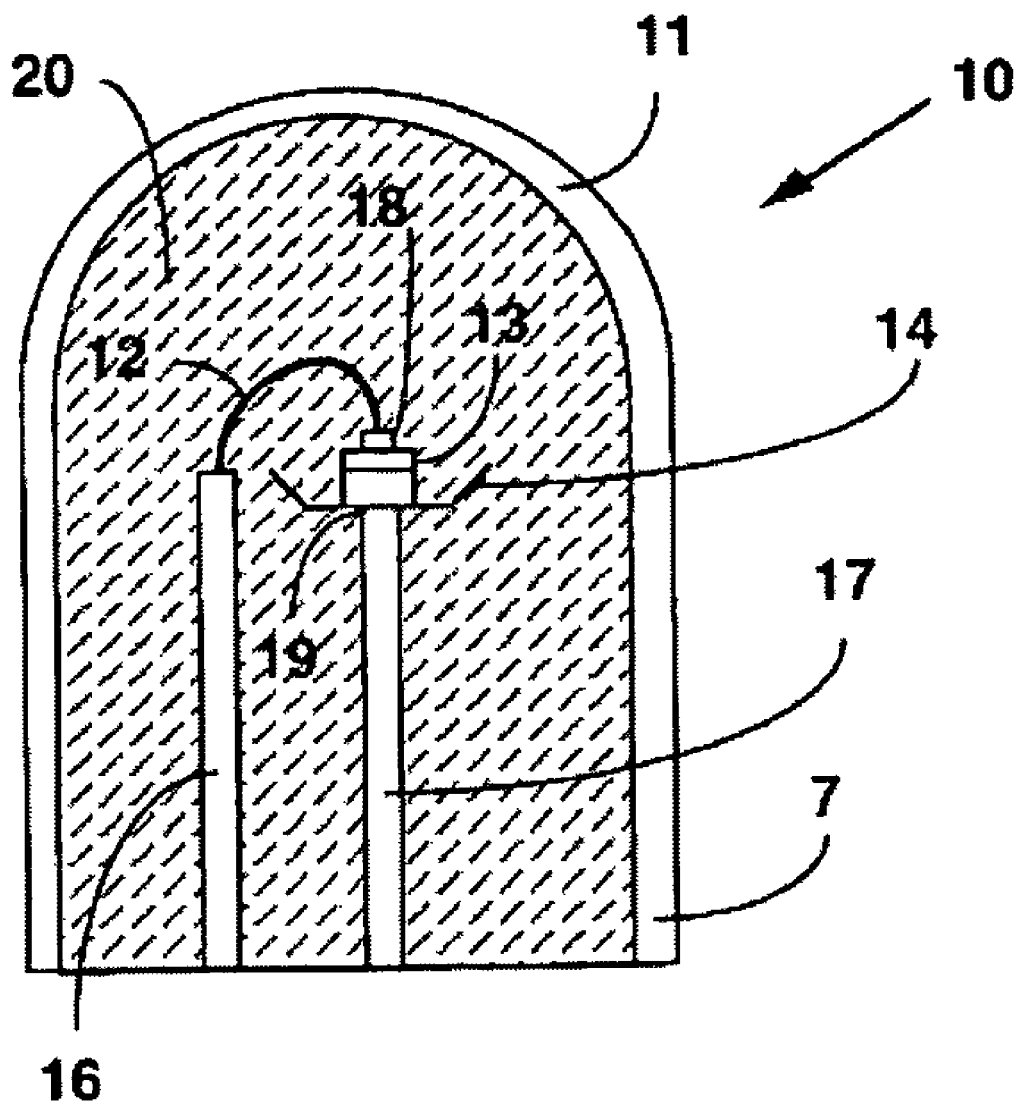
FIG. 1 is a schematic elevational cross-sectional view of a down-converting solid state device assembly for producing white light according to one embodiment of the present invention.

Referring now to the drawings, FIG. 1 shows a white light emitting diode assembly 10 constructed in accordance with the invention. This assembly comprises an enclosing wall 7 defining a light-transmissive enclosure 11 having an interior volume therewithin. The enclosure 11 may be formed of any suitable material having a light-transmissive character, such as a clear or translucent polymer, or a glass material. The light-transmissive enclosure 11 houses in its interior volume a light emitting diode (LED) die 13 positioned on support 14. First and second electrical conductors 16 and 17 are connected to the emitting and the rear faces 18 and 19 of LED die 13, respectively, and with the emitting face 18 of the LED die coupled to the first electrical conductor 16 by lead 12. The enclosure is filled with a suitable down-converting material 20, e.g., a down-converting medium comprising fluorescer and/or phosphor component(s), or mixtures thereof, viz., a luminophoric medium, which functions to down convert the light output from face 18 of LED 13 to white light.

In one embodiment, LED 13 comprises a leaded, gallium nitride based LED which exhibits blue light emission: with an emission maximum at approximately 450 nm with a FWHM of approximately 65 nm. Such a device is available commercially from Toyoda Gosei Co. Ltd. (Nishikasugai, Japan; see U.S. Pat. No. 5,369,289) or as Nichia Product No. NLPB520, NLPB300, etc. from Nichia Chemical Industries, Ltd. (Shin-Nihonkaikan Bldg. 3-7-18, Tokyo, 0108 Japan; see Japanese Patent Application 4-321,280). The down-converting material in this embodiment comprises a blue fluorescer (Lumogen® F Violet 570-substituted napthalenetetracarboxylic diimide), a green-yellow fluorescer (Lumogen® F Yellow 083-substituted perylenetetracarboxylic diimide) and a red fluorescer (Lumogen® F Red 300-substituted perylenetetracarboxylic diimide). A composition comprising such blue, green-yellow, and red fluorescent materials, all organic based, as incorporated in an insulating epoxy polymer, is available commercially from Pacific Polytech (Pacific Polytech, Incorporated, 15 Commercial Blvd., Novato, Calif. 94949-6135).

Both gallium nitride and silicon carbide LEDs are suitable for generating light at appropriate wavelengths and of sufficiently high energy and spectral overlap with absorption curves of the down-converting medium. The LED preferably is selected to emit most efficiently in regions where luminescent dyes may be usefully employed to absorb wavelengths compatible with readily commercially available fluorescers and/or phosphors for down conversion to white light.

The luminophoric medium utilized in the light emitting assembly of the present invention thus comprises a down-converting material which may include suitable luminescent dyes which absorb the radiation emitted by the LED or other solid state device generating the primary radiation, to thereby transfer the radiation energy to the fluorescer(s) and/or phosphor(s) for emission of white light. Alternatively, the luminophoric medium may comprise simply the fluorescer(s) and/or phosphor(s), without any associated mediating material such as intermediate luminescent dyes, if the fluorescer(s) and/or phosphor(s) are directly excitable to emit the desired white light.

Figure 2:
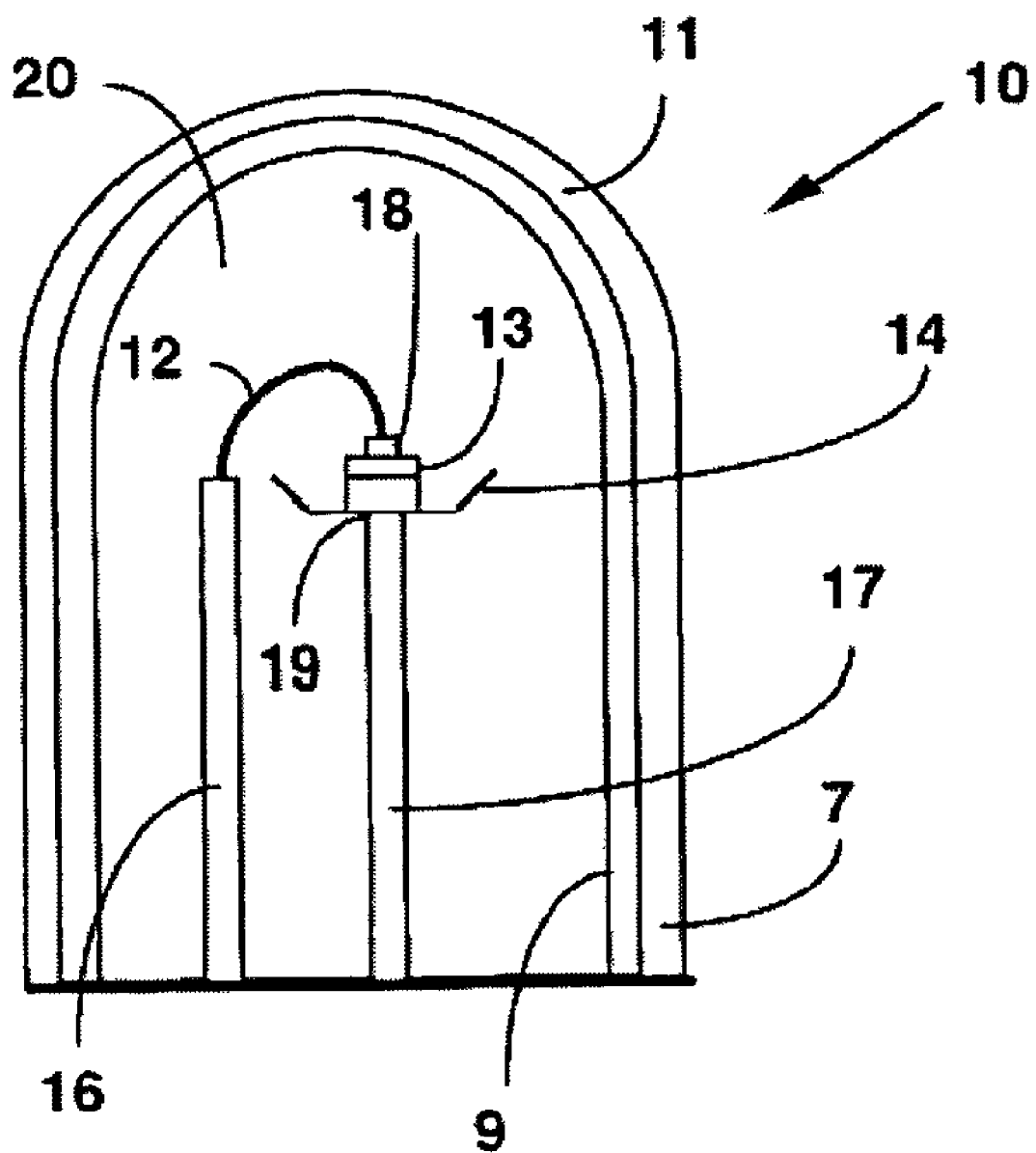
FIG. 2 is a schematic elevational cross-sectional view of another white light generating assembly according to another embodiment of the invention.

Such a light emitting assembly is shown in FIG. 2, wherein the same general structure is shown as in FIG. 1 (with the same reference numerals of corresponding parts for ease of reference), but in place of the luminophoric medium 20 shown in the embodiment illustrated in FIG. 1, the assembly of FIG. 2 utlizes a fluorescer associated with the light-transmissive housing 11. The fluorescer in such embodiment may be either dispersed in the wall 7 of the housing structure, and/or coated as an interior film 9 of the fluorescer on the interior wall surface of the housing wall 7. Alternatively, the fluorescer may be coated on an exterior wall surface of the housing of the assembly (not shown), if the housing is ultimately deployed in an environment where such exterior coating may be satisfactorily maintained in an operable state (e.g., where it is not subject to abrasion, or degradation). The fluorescer material may for example be dispersed in the polymer or glass melt from which the housing subsequently is formed, so as to provide a homogeneous composition of the housing wall providing light output from the entire area of the housing.

Comparing the structures of the FIGS. 1 and 2 assemblies, it is seen that the luminophoric medium in the FIG. 1 embodiment is contiguously arranged about the LED die structure in the interior volume of the housing, while the luminophoric medium in the FIG. 2 embodiment is disposed in spaced relationship to the LED die structure. It will be apparent that the specific arrangement of the solid state device such as LED 13, relative to the down-converting medium of the assembly, may be widely varied in the broad practice of the invention, it being necessary only that the solid state device functioning as the source of the primary shorter wavelength radiation be in transmitting relationship to the recipient luminophoric medium, so that the latter functions in use to down-convert the transmitted radiation from the solid state device and responsively thereto emit white light.

An ultraviolet LED light source suitable for use in the structure of FIG. 1 may comprise:

aluminum gallium indium nitride; aluminum gallium nitride; indium gallium nitride; gallium nitride or any other ultraviolet emitting diode. A blue LED light source may be based on:

indium gallium nitride; silicon carbide; zinc selenide; or any other blue light emitting diode source.

TBP, Coumarin-6 and DCM-1, as described by Kido et al. in European Patent EP 647694, are suitable materials for down conversion of the output of gallium nitride or silicon carbide LEDs. Gallium nitride and its alloys can emit in the spectral range covering the blue and ultraviolet extending from wavelengths of 200 nanometers to approximately 650 nanometers. Silicon carbide LEDs emit most efficiently in the blue at wavelengths of around 470 nanometers.

If gallium nitride emitters are employed, preferred substrates for the emitters include silicon carbide, sapphire, gallium nitride and gallium aluminum indium nitride alloys, and gallium nitride-silicon carbide alloys, for achieving, a proper lattice match.

With ultraviolet or blue light LEDs, aromatic fluorescers may be employed as down-converting emitters. By way of example, suitable fluorescers could be selected from:

A) blue luminescent compositions-9,10-diphenylanthracene; 1-chloro-9,10-diphenylanthracene; 2-chloro-9,10-diphenylanthracene; 2-methoxy-9,10-diphenylanthracene; 1,1,4,4-tetraphenyl-1,3-butadience (TPB), Lumogen® F Violet 570 (a substituted napthalenetetracarboxylic diimide); $Alq_2OPh$ (were Al is aluminum, q is 8-hydroxyquinolate, and Ph is phenyl);

B) green-yellow luminescent compositions-9,10-bis(phenylethynyl) anthracene; 2-chloro-9,10-bis(phenylethynyl)-anthracene; Coumarin-5(7-diethylamino-3-(2'benzothiazoyl)coumrin); Lumogen® Yellow 083 (a substituted perylenetetracarboxylic diimide); and $Mq_3$ (where M is a Group III metal, such as Al, Ga or In, and q is 8-hydroxyquinolate); and C) red-orange luminescent materials-DCM-1; Lumogen® F Red 300 (a substituted perylenetetracarboxylic diimide); Lumogen® F Orange 240 (a substituted perylenetetracarboxylic dimide); tetraphenylnapthacene; zinc phthalocyanine; [benzoythiazoylidene)methyl]- squaraines; tris(bipyridine-ruthenium (2+); and [3]-catenand complexes with copper.

The amount of dyes or fluorescers specifically formulated into the luminophoric medium, which may for example include a polymeric matrix or other matrix material in which the dyes and/or fluorescers are soluble or dispersable, is not specifically limited, and suitable amount(s) of suitable material(s) for such purpose can be readily determined without undue experimentation, to provide good white light emission (of virtually any tint or hue), as well as a virtually infinite series of chromaticity for all visible hues.

The concentrations of the fluorescers may suitably be determined by both their luminescence quantum yields and spectral distribution, as required to define a particular color by its respective chromaticity coordinates, as well as, in the case of radiative energy transfer (but not Forster energy transfer), the absorption extinction coefficients of the associated fluorescer(s). Such fluorescers may for example be blue light fluorescers used with a blue-emitting semiconductor-based LED die, or ultraviolet light fluorescers used with a UV-emitting semiconductor-based LED die. While the concentrations of the various dyes may be suitably adjusted to realize the required colors, the range of dye concentrations typically will be between $10^{-3}$ to 10 mole per cent for each individual fluorescent component.

Figure 3:
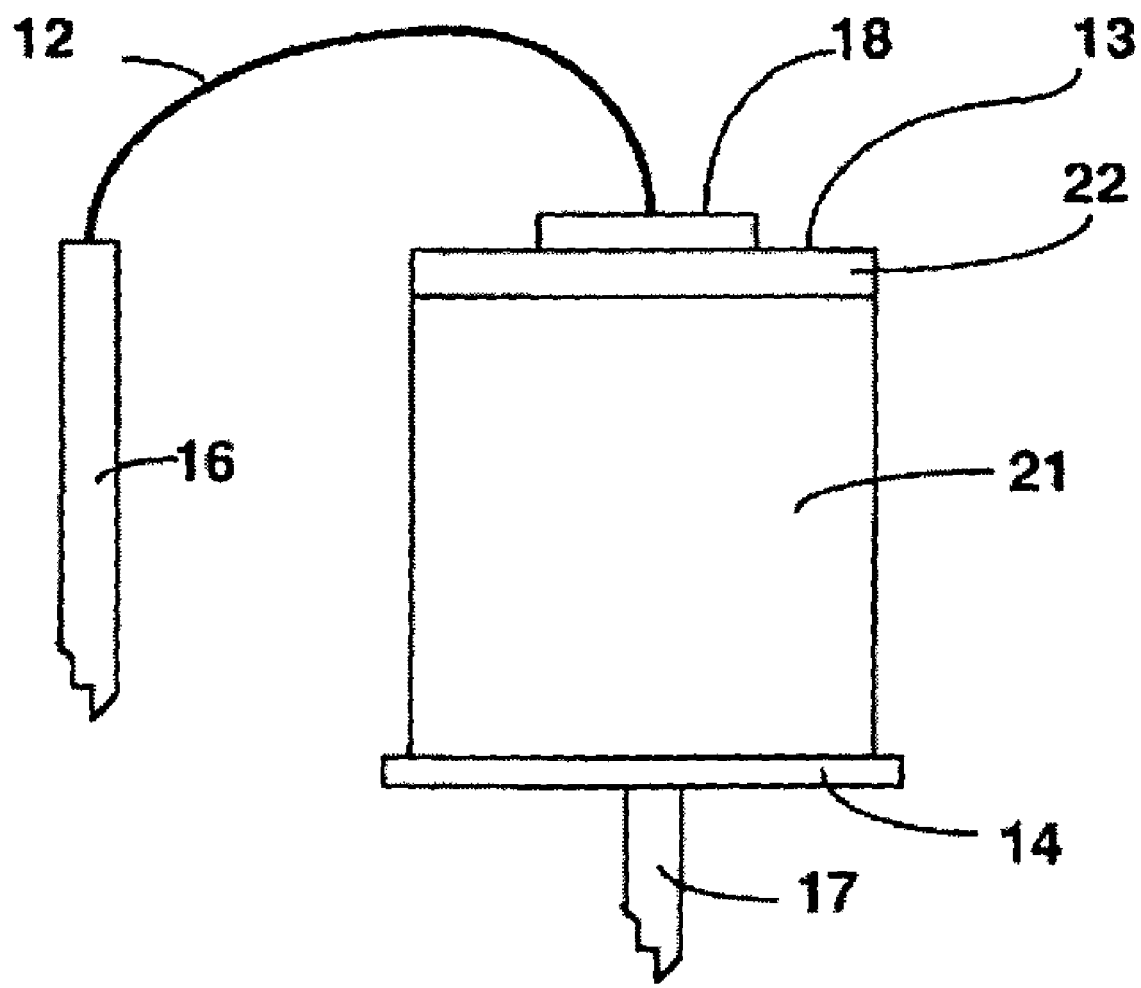
FIG. 3 is a schematic elevational cross-sectional view, in enlarged scale, of a portion of the device of FIG. 1.

FIG. 3 shows the LED structure of LED die 13 of FIG. 1 in an enlarged scale, as comprising substrate 21 mounted on support 14, and coupled in conducting relationship with second electrical conductor 17. The substrate comprises a surface layer 22 formed in accordance with well understood techniques. Referring back to FIGS. 1 and 2, the light emitted from LED 13 is absorbed by a down-converting dye in the luminophoric medium 20 contained within enclosure 11 (FIG. 1), or by a down-converting dye in the interior film 9 on the interior wall surface of housing wall 7 (FIG. 2), to responsively produce white (or full color) light.

Figure 4:
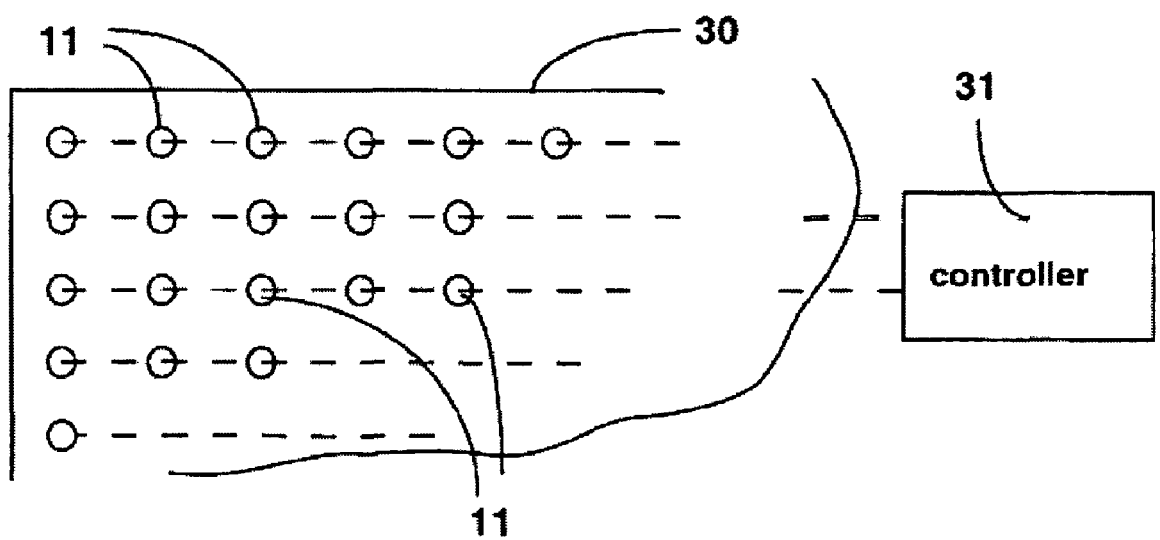
FIG. 4 is a schematic representation of a display which may usefully employ the device of FIGS. 1 and/or 2.

FIG. 4 illustrates the use of white light emitting diode device assemblies 11 of a type as shown in FIGS. 1 and 2, arranged in an array comprising a regular pattern of such assemblies, as components of a display 30, or alternatively for a back light illumination panel for a structure such as a liquid crystal display. The individual assemblies 11 may be selectively illuminated, by imposing a desired turn-on voltage across the first and second electrical conductors 16 and 17 (not shown in FIG. 4; see FIGS. 1 and 2), to display a message or design in a manner well understood in the art.

The selective illumination of the component light emitting assemblies 11 of the FIG. 4 display is suitably controlled by a controller 31 in response to user input. The individual light emitting assemblies 10 of FIGS. 1 and 2 are connected electrically with suitable electrical circuitry (not shown) in display 30, in a manner analogous to that used for displays utilizing flurorescent or incandescent lamps. Alternatively, all of the component light emitting assemblies 10 may be illuminated simultaneously for back lighting applications.

The light-emitting assemblies shown in FIGS. 1 and 2 may be made in any suitable size and dimensional character. In application to displays, such light-emitting assemblies will generally be of a size commensurate with the size of fluorescent or incandescent lamps used in similar displays.

Figure 5:
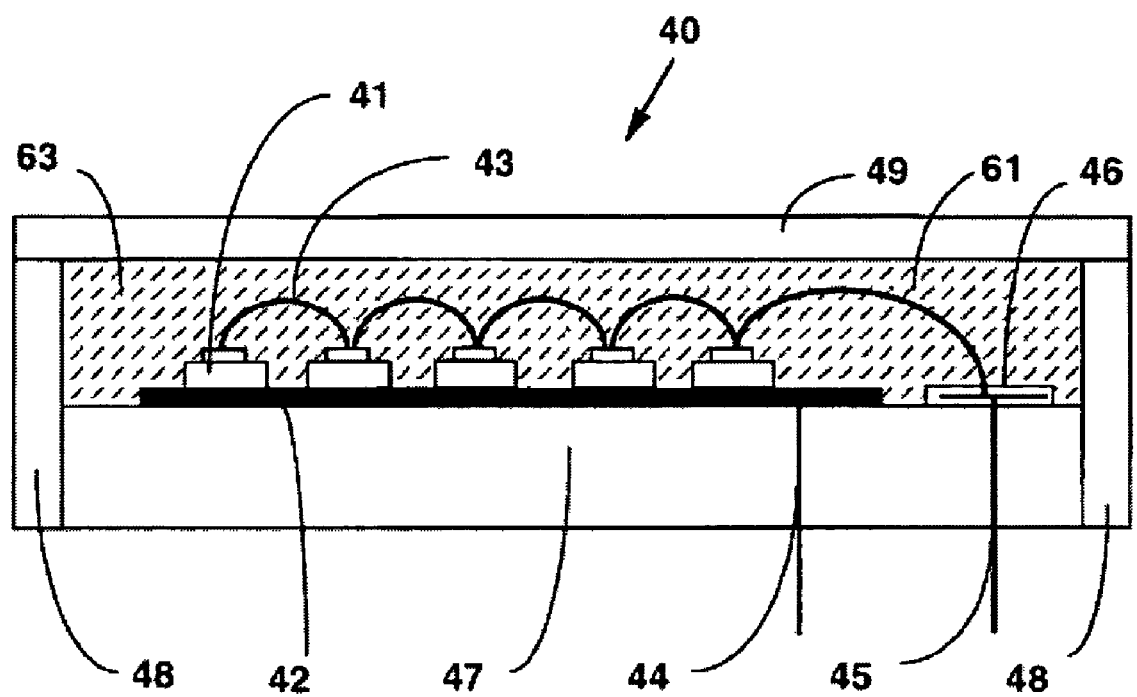
FIG. 5 is a schematic elevational view of an electroluminescent cell device according to another embodiment of the invention.

FIG. 5 is a schematic elevational view of an electroluminescent cell apparatus 40 according to another embodiment of the invention. This apparatus 40 comprises end wall members 48, top wall member 49, and bottom wall member 47, which cooperatively with front and rear wall members (not shown for clarity), form an enclosure defining interior volume 61 therewithin. The top wall member 49 is formed of a light-transmissive material of construction.

The interior volume 61 of the electroluminescent cell apparatus 40 contains a white light-emitting polymer 63 which is responsive to down-convert the radiation produced by the LED array in the interior volume. The LED array comprises a conductive substrate 42 of a suitable material on which are arranged a mulitplicity of LED dies 41, each in electrical contact at its bottom face with the substrate 42. The substrate 42 in turn is joined to a lead 44 which passes exteriorly of the cell apparatus via a feedthrough in bottom wall member 47, and is joined in circuit-forming relationship to a suitable power supply means (not shown). The LED dies 41 at their top faces are joined in series with one another by connection wires 43.

The top contact of the LEDs, joined by connecting wires 43, are electrically coupled by means of electrode 46 to the lead 45 which also passes exteriorly of the cell apparatus via a feedthrough in bottom wall member 47, for joining to the aforementioned power supply also joined to lead 44. Lead 45 is electrically isolated from lead 44.

In operation, the electrical energization of the LED die array comprising LED dies 41 effects radiation emission at a first relatively shorter wavelength which in transmission to the contiguously arranged light-emitting polymer 63 causes the polymer to responsively emit white light at a second relatively longer wavelength in the visible white light spectrum.

Figure 6:
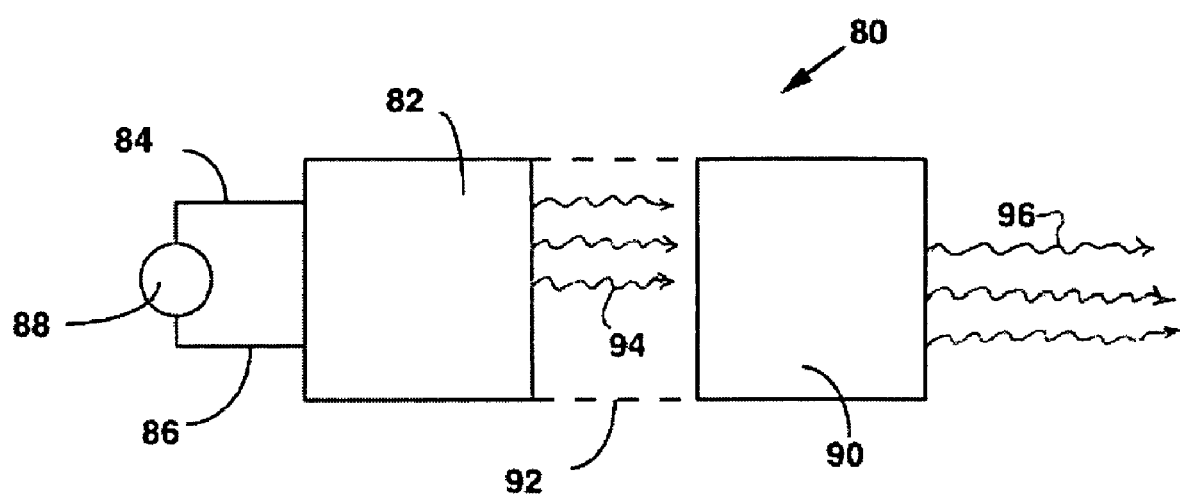
FIG. 6 is a schematic representation of the generalized light emitting assembly of the present invention.

FIG. 6 is a schematic representation of a generalized light emitting assembly 80 according to the present invention. In such assembly, the primary radiation generating device 82, comprising a solid state device which may include one or more, singly or in combinations of different devices, of the devices of the group consisting of semiconductor light emitting diodes, semiconductor lasers, thin film electroluminescent cells, electroluminescent display panels, organic based light-emitting diodes, polymeric-based light-emitting diodes, and internal junction organic electroluminescent devices. Preferably, the solid state device is selected from the group consisting of semiconductor light emitting diodes and semiconductor lasers, and most preferably the solid state device is a semiconductor light emitting diode.

The solid state light radiation emitting device 82 as shown is suitably joined by circuit-forming wires or leads 84 and 86 to a power supply 88, constructed and arranged to power the solid state device and induce the emission from the solid state device 82 of shorter wavelength radiation 94, preferably in the wavelength range of blue to ultraviolet. The solid state device 82 is structurally associated with a recipient down-converting luminophoric medium 90 (the structural association being schematically represented in FIG. 6 by the dashed line 92, and which may take the form of a contiguous relationship in a conjoint or unitary structure, or a spaced relationship therebetween in a same structure, as for example is shown in the illustrative embodiment of FIG. 2 herein).

The luminophoric medium 90 when impinged by the radiation 94 of a shorter wavelength, is excited to responsively emit a radiation 96 having a wavelength in the visible light spectrum. The radiation 96 may be emitted in a range of wavelengths which combine to produce light perceived as white.

It will be apparent from the foregoing that the light-emitting assembly of the present invention may be variously configured with a number of solid state light-emitting devices, which emit shorter wavelength radiation, and transmit such radiation to a luminophoric medium which down-converts the applied radiation to yield a white light emission from the luminophoric medium.

Further, while the invention has been described primarily herein in reference to the generation of white light, it will be apparent that the scope of the invention is not thus limited, but rathers extends to and encompasses the production of light of other colors than mixed white light, utilizing solid state primary radiation emitters, and down-converting luminophoric media.

Thus, while the invention has been described with reference to various illustrative embodiments, features, aspects, and modifications, it will be apparent that the invention may be widely varied in its construction and mode of operation, within the spirit and scope of the invention as hereinafter claimed.

What is claimed is:

1. A light emission assembly, comprising at least one light emission device including an LED emitting radiation with an emission maximum in a spectral range of the blue to ultraviolet spectrum, and a luminophoric medium impinged by radiation emitted from the LED and responsively emitting radiation in a range of wavelengths, which combine to produce a white light output from the light emission device, wherein said light emission device comprises at least one of the characteristics of:
   (i) the luminophoric medium being coated on and/or dispersed in light-transmissive material enclosing the LED; and
   (ii) the luminophoric medium being in contact with an emitting face of the LED.

2. The light emission assembly of claim 1, comprising a circuit including a power supply coupled to said at least one light emission device.

3. The light emission assembly of claim 1, comprising a multiplicity of said light emission devices.

4. The light emission assembly of claim 3, wherein said light emission devices are arranged in an array.

5. The light emission assembly of claim 3, comprising a display in which each of said light emission devices constitutes a pixel element of the display.

6. The light emission assembly of claim 5, wherein each of said light emission devices is adapted to be selectively illuminated so that the display produces messages.

7. The light emission assembly of claim 5, wherein each of said light emission devices is adapted to be selectively illuminated so that the display produces designs.

8. The light emission assembly of claim 3, wherein each of said light emission devices are connected to electrical circuitry.

9. The light emission assembly of claim 8, further comprising a controller adapted to selectively illuminate individual ones of the multiplicity of said light emission devices, in response to input to the controller.

10. The light emission assembly of claim 3, comprising a back lighting assembly including said multiplicity of said light emission devices.

11. The light emission assembly of claim 10, further comprising a display adapted to be back lit by said back lighting assembly.

12. The light emission assembly of claim 11, wherein said display comprises a liquid crystal display.

13. The light emission assembly of claim 1, comprising an enclosure in which said at least one light emission device is disposed.

14. The light emission assembly of claim 13, wherein said enclosure includes a light-transmissive structure.

15. The light emission assembly of claim 13, including a multiplicity of said LEDs.

16. The light emission assembly of claim 15, wherein said LEDs comprise LEDs mounted on a conductive substrate in said enclosure, in series relationship to one another.

17. The light emission assembly of claim 1, wherein the luminophoric medium comprises phosphor material.

18. The light emission assembly of claim 1, wherein the luminophoric medium comprises a material responsively emitting radiation in at least one of the green spectrum and the yellow spectrum.

19. The light emission assembly of claim 1, wherein said LED comprises a blue light LED.

20. The light emission assembly of claim 1, wherein said LED comprises a GaN LED energizable to emit blue light having an emission maximum at approximately 450 nm.

21. The light emission assembly of claim 1, wherein said white light output comprises primary radiation emission from the LED and secondary radiation emission from the luminophoric medium.

22. The light emission assembly of claim 1, wherein said at least one light emission device comprises an LED including a material selected from the group consisting of: gallium nitride; indium gallium nitride; aluminum gallium indium nitride; aluminum gallium nitride; silicon carbide; and zinc selenide.

23. The light emission assembly of claim 1, wherein the luminophoric medium comprises a material responsively emitting radiation in at least red, yellow and green spectral regions.

24. The light emission assembly of claim 1, wherein the luminophoric medium is coated on and/or dispersed in light-transmissive material enclosing the LED.

25. The light emission assembly of claim 1, wherein the luminophoric medium is coated on an interior surface of the light-transmissive material enclosing the LED.

26. The light emission assembly of claim 1, wherein the luminophoric medium is coated on an exterior surface of the light-transmissive material enclosing the LED.

27. The light emission assembly of claim 1, wherein the luminophoric medium is dispersed in the light-transmissive material enclosing the LED.

28. The light emission assembly of claim 1, wherein a layer of the luminophoric medium is in contact with an emitting face of the LED.

29. A light emission assembly, comprising at least one light emission device including an LED emitting radiation with an emission maximum in a spectral range of the blue to ultraviolet spectrum, and a luminophoric medium impinged by radiation emitted from the LED and responsively emitting radiation in a range of wavelengths, which combine to produce a white light output from the light emission device, wherein said light emission device comprises the luminophoric medium being coated on and/or dispersed in light-transmissive material forming a wall of an enclosure in which the LED is disposed.

30. A light emission assembly, comprising at least one light emission device including a GaN-based LED die emitting blue light, and a luminophoric medium impinged by blue light emitted from the LED die and responsively emitting radiation in a range of wavelengths, which combine to produce a white light output from the light emission device, wherein the luminophoric medium comprises phosphor material, and wherein (i) a layer of the phosphor material is on an interior or exterior surface of a light-transmissive enclosure defining an interior volume in which the LED die is mounted, and/or (ii) the phosphor material is contiguously arranged about an emitting surface of the LED die, and/or (iii) the phosphor material is in a polymeric matrix overlying the LED die.

31. The light emission assembly of claim 30, wherein a layer of the phosphor material is on an interior surface of a light-transmissive enclosure defining an interior volume in which the LED die is mounted.

32. The light emission assembly of claim 30, wherein a layer of the phosphor material is on an exterior surface of a light-transmissive enclosure defining an interior volume in which the LED die is mounted.

33. The light emission assembly of claim 30, wherein the phosphor material is contiguously arranged about an emitting surface of the LED die.

34. The light emission assembly of claim 30, wherein the phosphor material is in a polymeric matrix overlying the LED die.

35. The light emission assembly of claim 30, wherein the phosphor material comprises inorganic phosphor material.

36. The light emission assembly of claim 30, wherein the phosphor material comprises a mixture of phosphors.

37. The light emission assembly of claim 30, wherein the phosphor material has a spectral overlap with said blue light.

38. The light emission assembly of claim 30, wherein said LED die comprises an emitting surface in spaced-apart relationship to the phosphor material, without intervening structure between the emitting surface and the phosphor material.

39. The light emission assembly of claim 30, wherein each light emission device comprises circuit-forming elements cooperative with said LED die.

40. The light emission assembly of claim 30, comprising a light-transmissive wall bounding an enclosed interior volume in which the LED die is mounted.

41. The light emission assembly of claim 40, wherein the light-transmissive wall comprises a cylindrical sidewall portion and a hemispherical top portion.

* * * * *

(12) EX PARTE REEXAMINATION CERTIFICATE (9853rd)
United States Patent
Baretz et al.

(10) Number: US 7,943,945 C1
(45) Certificate Issued: *Sep. 20, 2013

(54) SOLID STATE WHITE LIGHT EMITTER AND DISPLAY USING SAME

(76) Inventors: Bruce Baretz, West Milford, NJ (US); Michael A. Tischler, Danbury, CT (US)

Reexamination Request:
No. 90/012,748, Dec. 24, 2012

Reexamination Certificate for:
Patent No.: 7,943,945
Issued: May 17, 2011
Appl. No.: 11/264,124
Filed: Nov. 1, 2005

(*) Notice: This patent is subject to a terminal disclaimer.

Related U.S. Application Data

(63) Continuation of application No. 10/623,198, filed on Jul. 18, 2003, now Pat. No. 7,615,795, which is a continuation of application No. 08/621,937, filed on Mar. 26, 1996, now Pat. No. 6,600,175.

(51) Int. Cl.
*H01L 33/50* (2010.01)
*H01L 25/07* (2006.01)

(52) U.S. Cl.
USPC .............................. 257/98; 257/100; 257/99

(58) Field of Classification Search
None
See application file for complete search history.

(56) References Cited

To view the complete listing of prior art documents cited during the proceeding for Reexamination Control Number 90/012,748, please refer to the USPTO's public Patent Application Information Retrieval (PAIR) system under the Display References tab.

*Primary Examiner* — Deandra Hughes

(57) ABSTRACT

A light emitting assembly comprising a solid state device coupleable with a power supply constructed and arranged to power the solid state device to emit from the solid state device a first, relatively shorter wavelength radiation, and a down-converting luminophoric medium arranged in receiving relationship to said first, relatively shorter wavelength radiation, and which in exposure to said first, relatively shorter wavelength radiation, is excited to responsively emit second, relatively longer wavelength radiation. In a specific embodiment, monochromatic blue or UV light output from a light-emitting diode is down-converted to white light by packaging the diode with fluorescent organic and/or inorganic fluorescers and phosphors in a polymeric matrix.

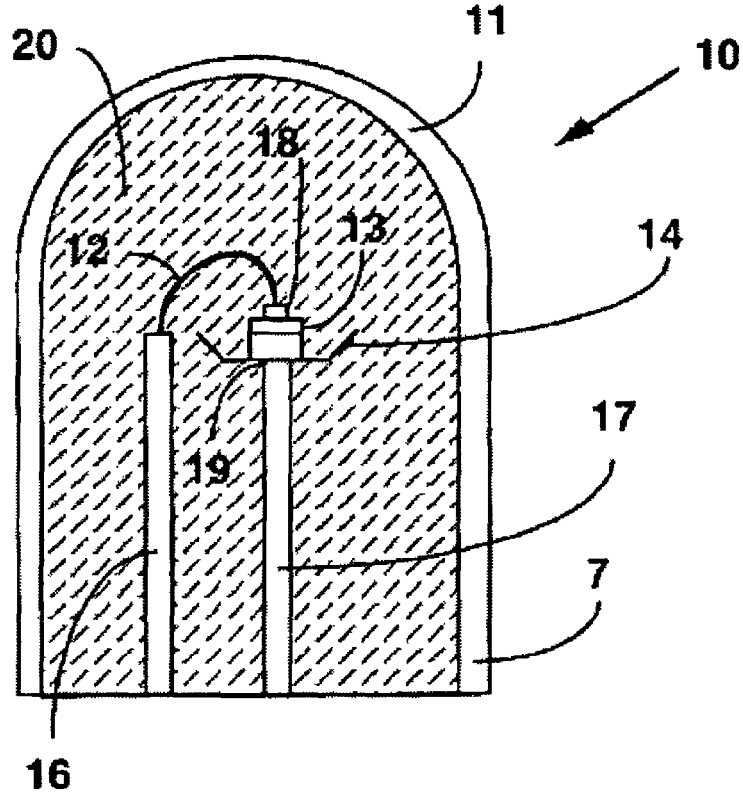

US 7,943,945 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 19-20 and 30-41 is confirmed.

Claims 1, 17 and 29 are cancelled.

Claims 2, 3, 13, 18 and 21-28 are determined to be patentable as amended.

Claims 4-12 and 14-16, dependent on an amended claim, are determined to be patentable.

New claims 42 and 43 are added and determined to be patentable.

2. The light emission assembly of claim [1] *42*, comprising a circuit including a power supply coupled to said at least one light emission device.

3. The light emission assembly of claim [1] *42*, comprising a multiplicity of said light emission devices.

13. The light emission assembly of claim [1] *42*, comprising an enclosure in which said at least one light emission device is disposed.

18. The light emission assembly of claim [1] *42*, wherein the luminophoric medium comprises a material responsively emitting radiation in at least one of the green spectrum and the yellow spectrum.

21. The light emission assembly of claim [1] *42*, wherein said white light output comprises primary radiation emission from the LED and secondary radiation emission from the luminophoric medium.

22. The light emission assembly of claim [1] *42*, wherein said at least one light emission device comprises an LED including a material selected from the group consisting of: gallium nitride; indium gallium nitride; aluminum gallium indium nitride; aluminum gallium nitride; silicon carbide; and zinc selenide.

23. The light emission assembly of claim [1] *42*, wherein the luminophoric medium comprises a material responsively emitting radiation in at least red, yellow and green spectral regions.

24. The light emission assembly of claim [1] *42*, wherein the luminophoric medium is *at least one of* coated on and[/or] dispersed in light-transmissive material enclosing the LED.

25. The light emission assembly of claim [1] *42*, wherein the luminophoric medium is coated on an interior surface of the light-transmissive material enclosing the LED.

26. The light emission assembly of claim [1] *42*, wherein the luminophoric medium is coated on an exterior surface of the light-transmissive material enclosing the LED.

27. The light emission assembly of claim [1] *42*, wherein the luminophoric medium is dispersed in the light-transmissive material enclosing the LED.

28. The light emission assembly of claim [1] *42*, wherein a layer of the luminophoric medium is in contact with an emitting face of the LED.

*42. A light emission assembly, comprising at least one light emission device including a blue light LED emitting radiation, and a luminophoric medium impinged by radiation emitted from the blue light LED and responsively emitting radiation in a range of wavelengths, which combine to produce a white light output from the light emission device, wherein said luminophoric medium comprises phosphor material, and wherein said light emission device comprises at least one of the characteristics of:*

*(i) the luminophoric medium being at least one of coated on and dispersed in light-transmissive material enclosing the blue light LED; and*

*(ii) the luminophoric medium being in contact with an emitting face of the blue light LED.*

*43. The light emission assembly of claim 42, wherein the light emission device comprises the luminophoric medium being at least one of coated on and dispersed in light-transmissive material forming a wall of an enclosure in which the blue light LED is disposed.*

\* \* \* \* \*